United States Patent [19]

Bodager et al.

[11] Patent Number: 5,443,937
[45] Date of Patent: Aug. 22, 1995

[54] AQUEOUS DEVELOPABLE PRECOLORED DIAZO IMAGING ELEMENT

[75] Inventors: Gregory A. Bodager, Monroeton, Pa.; Robert W. Peiffer, Newark, Del.

[73] Assignee: E. I. Du Pont de Nemours and Company, Wilmington, Del.

[21] Appl. No.: 277,850

[22] Filed: Jul. 20, 1994

Related U.S. Application Data

[63] Continuation of Ser. No. 732,871, Jul. 19, 1991, abandoned, which is a continuation-in-part of Ser. No. 661,289, Feb. 26, 1991, abandoned, which is a continuation-in-part of Ser. No. 559,463, Jul. 30, 1990, abandoned.

[51] Int. Cl.⁶ .......................... G03C 1/52; G03C 5/18
[52] U.S. Cl. ..................... 430/143; 430/175; 430/176; 430/257; 430/293; 430/325
[58] Field of Search .............. 430/143, 175, 176, 257, 430/293, 325

[56] References Cited

U.S. PATENT DOCUMENTS

| | | | |
|---|---|---|---|
| 3,671,236 | 6/1972 | VanBeusekom | 430/143 |
| 4,260,673 | 4/1981 | Krech | 430/143 |
| 4,446,218 | 5/1984 | Dhillon | 430/175 |
| 4,469,772 | 9/1984 | Barton et al. | 430/163 |
| 4,656,114 | 4/1987 | Cederberg et al. | 430/160 |
| 4,666,817 | 5/1987 | Sachi | 430/160 |
| 4,751,166 | 6/1988 | Platzer et al. | 430/160 |
| 4,783,390 | 11/1988 | Mino et al. | 430/156 |
| 4,808,508 | 2/1989 | Platzer | 430/143 |
| 4,937,168 | 6/1990 | Platzer | 430/143 |
| 5,112,743 | 5/1992 | Kamiya et al. | 430/176 |
| 5,122,442 | 6/1992 | Moskowitz et al. | 430/176 |

FOREIGN PATENT DOCUMENTS

| | | |
|---|---|---|
| 0303851 | 10/1989 | European Pat. Off. |
| 2183749 | 12/1973 | France |
| 2030634 | 1/1971 | Germany |
| 63-146037 | 6/1988 | Japan |
| 1191659 | 5/1970 | United Kingdom |
| 1254475 | 11/1971 | United Kingdom |
| 2144867 | 3/1985 | United Kingdom |

OTHER PUBLICATIONS

J. Albrecht, Polyvinyl Alcohol as Lithographic Printing Material, Interscience Publishers, Inc., New York, 1944, pp. 32–33.

Primary Examiner—Janet C. Baxter
Assistant Examiner—Mark F. Huff

[57] ABSTRACT

A precolored, water-developable, photosensitive elements comprising:
(A) a support;
(B) a colorant-containing layer consisting essentially of
  (1) a colorant, and
  (2) a polyvinyl alcohol binder, said binder being about 87–100% hydrolyzed and being of sufficiently high molecular weight to be film-forming; and
(C) a photosensitive layer consisting essentially of:
  (3) a photosensitive, water-soluble, polymeric diazo resin; and
  (4) a polyvinyl alcohol binder, said binder being about 87–100% hydrolyzed and being of sufficiently high molecular weight to be film-forming; and
(D) an adhesive layer;
wherein said colorant-containing layer (B) and said photosensitive layer (C) may be combined into a single layer colorant-containing, photosensitive coating (E) which must be in contact with the adhesive layer (D) or alternatively, said colorant-containing layer (B) and said photosensitive layer (C) may be in separate but contiguous layers provided that either layer (B) or (C) must be in contact with the adhesive layer (D), and provided that either the colorant-containing layer (B), the photosensitive layer (C) or the adhesive layer (D) is in contact with the support (A).

41 Claims, 1 Drawing Sheet

AQUEOUS DEVELOPABLE PRECOLORED DIAZO IMAGING ELEMENT

CROSS REFERENCE TO RELATED APPLICATIONS

This is a continuation of application Ser. No. 07/732,871, filed Jul. 19, 1991, now abandoned, which is a continuation-in-part of Ser. No. 07/661,289 filed Feb. 26, 1991, now abandoned, which is a continuation-in-part of Ser. No. 07/559,463 filed Jul. 30, 1990, now abandoned.

FIELD OF THE INVENTION

This invention relates to a photosensitive element which can be used in image-reproduction processes. More particularly it relates to a precolored, water-developable, photosensitive element comprising a support, a photosensitive coating, and an adhesive layer. The photosensitive coating further comprises a colorant; a photosensitive, water-soluble, polymeric diazonium salt; and a polyvinyl alcohol binder.

BACKGROUND OF THE INVENTION

Photosensitive elements which can be used in image-reproduction processes are well-known in the graphic arts industry. Typically, the elements are exposed to actinic radiation through an image-bearing transparency, such as a color separation transparency, to produce an image which is either a positive or negative with respect to the transparency used. Positive-working elements produce an image which is a duplicate of the transparency through which they are exposed. That is, the colored regions of the transparency are colored in the imaged element and the uncolored regions in the transparency are uncolored in the imaged element. Negative-working elements produce an image that is the reverse of the transparency through which they are exposed. That is, the colored regions of the transparency are uncolored in the imaged element and the uncolored regions in the transparency are colored in the imaged element. Ordinarily, a positive-working element is exposed through a positive transparency to produce a positive image and a negative working element is exposed through a negative transparency to produce a positive image. Following imagewise exposure, the photosensitive elements may be developed by washing out the soluble image areas, by peeling apart, by toning with a colorant, or combinations of these techniques.

Precolored diazo based imaging elements are well known in the art. These elements, however, have the disadvantage of requiring either an organic solvent or aqueous base for coating and/or development. Precolored diazo based imaging elements which are developed in a mixture of 1-propanol and water are disclosed, for example, in Van Beusekom, U.S. Pat. No. 3,671,236; Cederburg, U.S. Pat. No. 4,656,114; and Sachi, U.S. Pat. No. 4,666,817. An element which can be developed in base is disclosed in Krech, U.S. Pat. No. 4,260,673. Frequently, the use of an aqueous base or organic solvent is undesirable due to flammability, toxicity, corrosion and/or waste disposal considerations.

Platzer, U.S. Pat. No. 4,751,166, discloses a precolored negative working diazo image-forming element containing a binder selected from the group consisting of a polyvinyl butyral polymer and a styrene-maleic anhydride polymer. The element is developable in water containing surfactants such as (1) sodium decyl sulfate, disodium phosphate and sodium metasilicate, or (2) monosodium phosphate, trisodium phosphate, and sodium tetradecyl sulfate.

Mino, U.S. Pat. No. 4,783,390, discloses a multicolor diazo image-forming element comprising at least two colorant-containing photosensitive layers on a support. Each photosensitive layer is formed from a water-soluble, organic solvent-insoluble diazo resin; a water-soluble resin having photocrosslinking ability with the diazo resin; and a water dispersible colorant. Between each photosensitive layer and the next adjacent photosensitive layer is an intermediate layer formed from a hydrophobic, water-resistant organic solvent-softenable resin. Although the photosensitive layer can be developed by water, the intermediate layer is removed by an organic solvent. In addition, the image formed on the upper photosensitive layer is sometimes washed away when the lower layers are developed. The material is limited to the reproduction of continuous tone images.

Maruyama, Japanese Patent Application 61-292,295, discloses a water-developable composition composed of a diazo resin, polyvinyl pyrrolidone having a mean molecular weight of about 20,000 to 1,000,000 and a colorant. Although the composition is water-developable, it has the disadvantage of being coated from organic solvents.

There is a need for a photosensitive element which can be both coated from, and developed in water, thereby eliminating the requirement of organic solvents, surfactants, and aqueous bases in both the manufacturing process and the process of use. This element should be capable of reproducing both half tone and continuous tone images.

SUMMARY OF THE INVENTION

This invention relates to a precolored, water-developable, photosensitive element comprising:
(A) a support;
(B) a colorant-containing layer consisting essentially of:
  (1) a colorant, and
  (2) a polyvinyl alcohol binder, said binder being about 87–100% hydrolyzed and being of sufficiently high molecular weight to be film-forming; and
(C) a photosensitive layer consisting essentially of:
  (3) a photosensitive, water-soluble, polymeric diazo resin; and
  (4) a polyvinyl alcohol binder, said binder being about 87–100% hydrolyzed and being of sufficiently high molecular weight to be film-forming; and
(D) an adhesive layer;

wherein said colorant-containing layer (B) and said photosensitive layer (C) may be combined into a single layer colorant-containing, photosensitive coating (E) which must be in contact with the adhesive layer (D) or alternatively, said colorant-containing layer (B) and said photosensitive layer (C) may be in separate but contiguous layers provided that either layer (B) or (C) must be in contact with the adhesive layer (D), and provided that either the colorant-containing layer (B), the photosensitive layer (C) or the adhesive layer (D) is in contact with the support (A).

In one embodiment the colorant-containing layer and the photosensitive layer are combined into a single layer. In a preferred embodiment for the production of surprint proofs by the exposure in register process, the element comprises, in order from top to bottom: an adhesive layer, a photosensitive layer, colorant-containing layer, and a support.

In another embodiment, the adhesive layer may be omitted. Imagewise exposure of a series of precolored, photosensitive elements through color separation transparencies produces a set of precolored images which are stacked in register to form an overlay proof.

BRIEF DESCRIPTION OF THE DRAWINGS

In the accompanying Figures forming part of this disclosure.

DETAILED DESCRIPTION OF THE INVENTION

Photosensitive Coating

Figure 1:
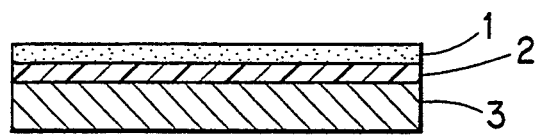
FIG. 1 illustrates a three layered photosensitive element comprising in order from top to bottom, an adhesive layer (1), a colorant-containing, photosensitive layer (2), and a support (3).

The photosensitive element of the claimed invention comprises a support, a photosensitive coating, and an adhesive layer. The photosensitive element further comprises a colorant. The photosensitive layer and the colorant may be present as either a one layer or two layer structure; i.e., the photosensitive coating comprises either (1) a single photosensitive, colorant-containing layer or (2) a photosensitive layer and a contiguous colorant-containing layer. An important feature of the photosensitive coating is that it is totally water-developable without the need for surfactants or other additives. In fact, development can take place using ordinary tap water, thus eliminating the need for aqueous base or organic solvents.

The photosensitive layer comprises a photosensitive diazo resin and a polyvinyl alcohol binder. The photosensitive diazo resin is a photosensitive, water-soluble, diazonium salt, such as a 4-(phenylamino)benzenediazonium formaldehyde polymer. Representative materials are: the zinc chloride complex of the 4-(phenylamino)-benzenediazonium sulfate (1:1) formaldehyde polymer, the zinc chloride complex of the 4-(phenylamino)-benzenediazonium phosphate (1:1) formaldehyde polymer, the cobalt chloride complex of the 4-(phenylamino)-benzenediazonium (1:1) formaldehyde polymer, the uncomplexed 4-(phenylamino)benzenediazonium phosphate (1:1) formaldehyde polymer, and the uncomplexed 4-(phenylamino)-benzenediazonium sulfate (1:1) formaldehyde polymer. Since their development does not produce effluent containing heavy metals, the uncomplexed 4-(phenylamino)-benzenediazonium phosphate (1:1) formaldehyde polymer and the uncomplexed 4-(phenylamino)-benzenediazonium sulfate (1:1) formaldehyde polymer are preferred.

The colorant-containing layer comprises a colorant and a polyvinyl alcohol binder. Colorants may be selected from a wide variety of conventional pigments, dyes or other coloring materials known to those of skill in the art. The colorant should be dispersible in water and should not react with the other components of the layer.

The binder in the photosensitive and the colorant layers, or in the single layer when the layers are combined, is polyvinyl alcohol. Polyvinyl alcohol is soluble in water thus, the layers may be coated from, and the exposed image washed out with water. The binder must be of sufficient molecular weight that a film is formed when the layer is coated. A molecular weight of about 11,000 to 186,000 is preferred. A molecular weight of 106,000 to 186,000 is more preferred. The polyvinyl alcohol must be sufficiently hydrolyzed so that it is soluble in water. Polyvinyl alcohols which are about 87–100% hydrolyzed are preferred.

Conventional additives may also be added to the photosensitive and/or colorant-containing layer(s) provided they are compatible with the other ingredients present in the layer and do not impart unwanted color to the final image. Such components may include antihalation agents, optical brightening agents, release agents, surfactants, coating aids, and plasticizers.

A preferred composition for the colorant-containing layer is: about 5–20% colorant, about 80–95% binder, and about 0–2% other ingredients. A preferred composition for the photosensitive layer is: about 2–6% diazo resin, about 94–98% binder, and about 0–2% other ingredients. When the colorant and photosensitive resin are present in a single layer, a preferred composition is: about 5–20% colorant, about 2–6% diazo resin, about 75–93% binder, and about 0–2% other ingredients.

Adhesive Layer

An adhesive layer is also present. The adhesive layer will be in contact with the colorant-containing photosensitive coating, or, if a colorant-containing layer and a photosensitive layer are present, either of said layers may be in contact with the adhesive layer. The adhesive layer comprises a water-insoluble polymeric binder. The binder should produce a colorless, optically transparent film which can be heat laminated onto a receptor. Materials useful for the adhesive layer include polyvinyl acetate and copolymers and terpolymers thereof, as well as polyesters and polyamides. Plasticizers and surfactants may also be present in the adhesive layer.

Support/Receptor/Temporary Carrier

The photosensitive element also comprises a support. The support may be any suitable material which has the necessary stiffness and dimensional stability; however, a polyethylene terephthalate support is preferred. A removable support is required for preparation of a surprint proof. However, a nonremovable support is required for preparation of an overlay proof. In the preparation of a surprint proof, a separate release layer may be situated between the support and the adjacent layer, particularly when the support is contiguous to the adhesive layer. Alternatively, a silicone release treated polyethylene terephthalate support may be used. However, a release layer is usually not required when the colorant-containing and/or photosensitive layer is contiguous to the support because the binder, polyvinyl alcohol, is also a release agent. Polyacrylamide and polyvinylpyrrolidone may also be used as a release layer.

The receptor for the exposure in register process may be any material which has the necessary stiffness, dimensional stability, and water resistance. The receptor is flat and preferably smooth and opaque. Exemplary materials which may be used as the receptor include films, such as a polyethylene terephthalate of photographic grade which may be subbed as described in Alles, U.S. Pat. No. 2,779,684; adhesive subbed opaque polyethylene terephthalate film base, such as Melinex ®, sold by ICI Americas, Wilmington, Del.; and paper stock treated to make it resistant to aqueous solvents. The preferred material is polyethylene terephthalate film.

A temporary carrier is required when the element is used to prepare an image by the transfer in register process. Materials which may be used as the temporary carrier are the same materials which may be used as the receptor. The temporary carrier bears an adhesive layer and a release layer which may each be comprised as described above. The structures which may be used are temporary carrier, release layer, and adhesive layer; or temporary carrier, adhesive layer, and release layer. As indicated below, the image formed on the temporary carrier may be transferred to any desired receptor. Transfer to the stock which will be used for printing is preferred.

Manufacture

Figure 2:
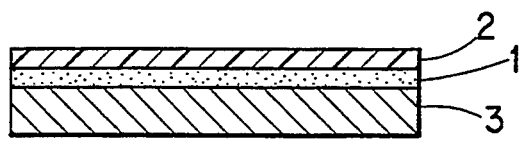
FIG. 2 illustrates a three layered photosensitive element comprising in order from top to bottom, a colorant-containing, photosensitive layer (2), an adhesive layer (1) and a support (3).
Figure 3:
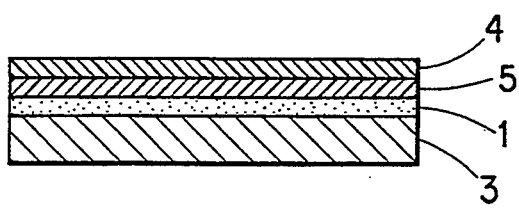
FIG. 3 illustrates a four layered photosensitive element comprising in order from top to bottom, a photosensitive layer (4), a colorant-containing layer (5), an adhesive layer (1), and a support (3).
Figure 4:
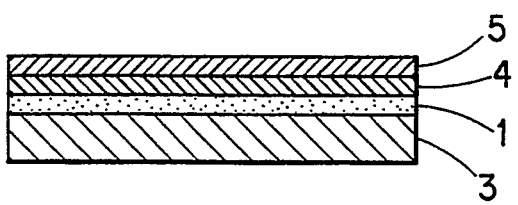
FIG. 4 illustrates a four layered photosensitive layer comprising in order from top to bottom, a colorant-containing layer (5), a photosensitive layer (4) an adhesive layer (1), and a support (3).
Figure 5:
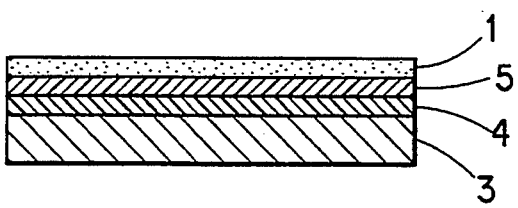
FIG. 5 illustrates a four layered photosensitive layer comprising in order from top to bottom, an adhesive layer (1), a colorant-containing layer (5), a photosensitive layer (4), and a support (3).
Figure 6:
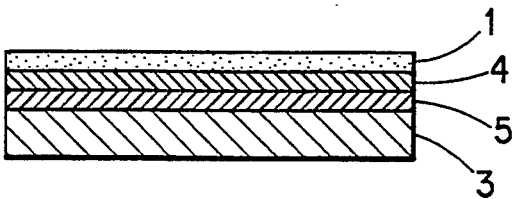
FIG. 6 illustrates a four layered photosensitive layer comprising in order from top to bottom, an adhesive layer (1), a photosensitive layer (4), a colorant-containing layer (5), and a support (3).

Six embodiments of the element comprising the support, colorant-containing layer, photosensitive layer, and adhesive layer are possible as illustrated in the Brief Description of Drawings. In one pair of embodiments the colorant and photosensitive resin are contained in a single colorant-containing, photosensitive layer. FIGS. 1 and 2 show that the layers may be arranged in order from top to bottom (1) adhesive layer, colorant-containing, photosensitive layer; and support, or (2) colorant-containing, photosensitive layer, adhesive layer and support. In the four remaining embodiments, the photosensitive layer and colorant-containing layers are in separate but contiguous layers. FIGS. 3–6 show that the following arrangements are possible: (3) photosensitive layer, colorant-containing layer, adhesive layer and support (4) colorant-containing layer, photosensitive layer, adhesive layer and support; (5) adhesive layer, colorant-containing layer, photosensitive layer and support and (6) adhesive layer, photosensitive layer, colorant-containing layer and support. Embodiments (2), (3), and (4), in which the adhesive layer is in contact with the support, are used in the preparation of images by the transfer in register process. Embodiments (1), (5), and (6), in which the adhesive layer is not in contact with the support, are used in the preparation of images by the exposure in register process. Embodiment (6) is preferred for transfer to a receptor in the production of surprint proofs by the exposure in register process. In this embodiment, stain, i.e, the color remaining on the receptor in the unexposed areas following washout, is eliminated. Embodiment (4) is preferred for transfer to a temporary carrier in the production of surprint proofs by the transfer in register process.

The element may be prepared by conventional coating techniques. To produce an element comprising in order: support, photosensitive colorant-containing coating, and adhesive layer, the photosensitive coating is prepared by mixing the ingredients in water, usually in the weight ratio of about 8 to 92 (solids to water); coating onto the support; and evaporating the water. Coatings should be uniform. A coating weight of about 20 mg/dm$^2$ dry coating weight, generally providing a thickness of about 1 to 3 microns, is preferred. When the colorant and photosensitive resin are present in a single layer, all the ingredients are mixed in water before coating onto the support. When two separate layers are present, one layer is coated onto the support and dried and the other layer coated on top of it. The adhesive layer is coated from an appropriate solvent on top of this layer. Multilayer coating may also be carried out using conventional multilayer coating techniques.

To produce an element comprising, in order: support, adhesive layer, and photosensitive, colorant-containing coating, the adhesive layer is first coated onto the support. Afterwards, the photosensitive coating is coated onto the adhesive layer, instead of the support, as described above.

After the last layer has been coated and the solvent evaporated, a release film, such as polyethylene, may be placed over the coating to protect it until the element is ready for use.

Exposure/Image Formation

Any convenient source providing actinic radiation absorbed by the photosensitive resin can be used to activate the imaging reaction. "Actinic radiation" is any radiation which produces imaging. The radiation can be natural or artificial, monochromatic or polychromatic, incoherent or coherent. For efficient image formation, most of the actinic radiation should be absorbed by the photosensitive resin.

Conventional sources of actinic radiation include fluorescent, mercury vapor, mercury-xenon, metal additive, and arc lamps. Lasers whose emissions fall within or overlap the absorption bands of the initiator system are useful sources of coherent radiation. Exposure is ordinarily carried out through a halftone image-bearing transparency, preferably a halftone color separation transparency. However, alternative ways of imagewise exposing the element include a modulated scanning laser beam, CRT (cathode ray tube), and the like. Exposure can also be carried out through a continuous tone image-bearing transparency.

The photosensitive elements of the claimed invention may be used to prepare negative surprint proofs by either the exposure in register process or the transfer in register process.

Exposure In Register Process

In using the elements to prepare negative surprint proofs from conventional negative halftone color separation transparencies by the exposure in register process, an element comprising, in order: support; photosensitive coating; and adhesive layer is required. As previously discussed, the photosensitive coating may be either a single layer, as in embodiments (1) and (2) or two separate layers, as in embodiments (3) through (6). The preferred embodiment (6) comprises a support; a colorant-containing layer; a photosensitive layer; and an adhesive layer.

The release film, if present, is removed from the element and the adhesive layer of the element is laminated to the receptor. The support is peeled off to produce an element consisting of receptor; adhesive layer; a photosensitive layer, and a colorant-containing layer. Following the removal of the support, the element is exposed to actinic radiation through a negative separation transparency with the emulsion side of the transparency in contact with the photosensitive coating. To ensure good contact between the transparency and the coating, exposure is conveniently carried out in a standard vacuum frame. The photosensitive coating is sprayed with tap water to wash off the non-exposed areas. During washout, the exposed element may be gently brushed or rubbed with cotton. The washed out element is dried to produce a single color surprint proof which is a negative of the transparency used for exposure.

If a two color surprint image is desired, a second, differently precolored, photosensitive element may be laminated to the image previously formed and the support removed to produce an element consisting of receptor; adhesive layer; first exposed and washed out photosensitive coating; adhesive layer; and second photosensitive coating. The second photosensitive coating is exposed in register through its corresponding color separation transparency and washed out as described above to produce a two color surprint proof which is the negative of the transparencies used for exposure. To form a multicolor or surprint proof, additional, differently precolored, photosensitive elements may be laminated to this image, exposed in register through their corresponding color separation transparencies and washed out. A four-color surprint proof consisting of yellow, cyan, magenta, and black images, may be formed in this manner. If desired, the image may be covered with a conventional protective film.

Transfer In Register Process

The photosensitive element may be used to prepare negative surprint proofs from conventional negative halftone color separation transparencies by the transfer in register process. The element comprises in order: a support; an adhesive layer; and a colorant-containing photosensitive coating. As discussed above, the photosensitive coating may be either a single layer, as in embodiment (2) or two separate layers, as in embodiments (3) and (4). Embodiment (4) is the preferred embodiment. The support must be release treated, such as silicone release treated polyester film, or alternatively, a separate release layer, as described above, must be present between the support and the adhesive layer. The following process applies for element comprising a release layer.

The release film, if present, is removed from an element. The element is then exposed to actinic radiation through a negative separation transparency with the emulsion side of the transparency in contact with the photosensitive coating and washed out with tap water as described above. The washed out element is dried to produce a single color image consisting of: a support; a release layer; an adhesive layer; and first exposed and washed out photosensitive coating.

The single color image is transferred to a temporary carrier by laminating the washed out photosensitive coating to the adhesive layer of a temporary carrier comprising a release layer and an adhesive layer. The temporary carrier may have the following structures: temporary carrier, release layer, and adhesive layer; or temporary carrier, adhesive layer and release layer. Lamination is carried out with heat and pressure. The first color film support and release layer are subsequently removed to reveal the adhesive layer, and produce an element comprising in order: the temporary carrier; temporary carrier release layer, temporary carrier adhesive layer, first imagewise washed-out photosensitive coating; and adhesive layer. This element is a wrong-reading or inverted image.

A second colored image is prepared by removing the release film, if present, from a second differently colored element, exposing, and washing out as described above. The second colored image is laminated in register to the element comprising the temporary carrier; first imagewise washed-out photosensitive coating; and adhesive layer. The support is removed to produce an element comprising: temporary carrier; first imagewise washed-out photosensitive coating; adhesive layer; second imagewise washed-out photosensitive coating; and adhesive layer. The second color film support and release layer are removed. Additional different colored elements may be exposed, washed out, transferred in register, and the support removed, to produce a multicolor wrong-reading element on the temporary carrier. The surface of the element opposite the temporary carrier is the adhesive layer of the last colored image laminated to the element.

A right-reading multicolored image is obtained by laminating the revealed adhesive layer onto a permanent support, typically the desired printing stock. The temporary carrier is then removed, separating, depending on the position of the release layer on the temporary carrier, either between the temporary carrier's release layer and adhesive layer or between the temporary carrier's adhesive layer and the first colored image.

Overlay Proof

If a single color image is desired for use, for example as an overlay proof, transfer of the photosensitive layer to a receptor is not necessary. The element comprises a photosensitive coating on a water resistant nonremovable support. An adhesive layer is not required, and may be omitted if desired. If the adhesive layer is omitted, it is preferred that the nonremovable support be corona discharge treated in order to improve adhesion. The element is exposed and washed out as described above to produce a single color image consisting of the exposed and developed photosensitive coating on the support. If an overlay proof is desired, an optically transparent support is required.

In an overlay proof, each color remains on a separate support. The individual films are assembled in register and viewed as a composite against an appropriate background, e.g., an opaque reflective white receptor sheet. The individual colored elements remain separable and can be combined separately.

To form a multicolor overlay proof, a plurality of single colored images is prepared from a plurality of single colored photosensitive elements. Each element is imagewise exposed through its corresponding color separation transparency and washed out as described above to produce a colored image. Exposure may be carried out with the transparency in contact with the photosensitive coating as described above. Alternatively, exposure may be carried out through the support, that is, with the emulsion side of the transparency in contact with the support. The colored images are stacked in register, preferably on an opaque reflective white receptor sheet, to form an overlay proof.

As disclosed in Matthews, U.S. Pat. No. 5,001,037, precolored images may be combined with toned images to form overlay proofs comprising both precolored and toned images. Conventional overlay proofing films are precolored by their manufacturers. Thus, the operator is limited to those colors provided by the manufacturer. Due to the cost of manufacture and distribution, only a limited range of colors is available. Overlay images with specialty, i.e., non-standard colors, are readily prepared from non-colored, tonable elements. The operator can mix the toners supplied by the manufacturer as desired. Thus, toned images with an almost unlimited variety of colors can be prepared and combined with precolored images in the preparation of overlay proofs.

Industrial Applicability

The elements of this invention are useful for preparing colored images. These images are particularly useful in the graphic arts field, especially in the area of color proofing wherein proofs are prepared to duplicate the images produced by printing.

The advantageous properties of this invention can be observed by reference to the following examples which serve to illustrate, but do not limit, the practice of the present invention.

| GLOSSARY | |
|---|---|
| Aerosol ® TO-75 | 75% by weight sodium dioctyl sulfosuccinate (CAS 577-11-7) in water/alcohol; American Cyanamid, Wayne, NJ |
| Aerosol ® TO-100 | Sodium dioctyl sulfosuccinate; CAS 577-11-7; American Cyanamid, Wayne, NJ |
| Black Pigment No. 1 | Flexiverse ® II Carbon Black pigment dispersion; Sun Chemical, Cincinnati, OH |
| Black Pigment No. 2 | Unisperse ® Black B-PI pigment dispersion; Ciba-Geigy Corporation, Ardsley, NY |
| Cyan Pigment | Sunsperse ® 6000 Phthalo Blue, RS; Sun Chemical, Cincinnati, OH |
| Diazo Resin No. 4 | 4-(Phenylamino)-benzenediazonium sulfate (1:1) formaldehyde polymer, zinc chloride complex; CAS 68988-17-0; Fairmount Chemical, Newark, NJ |
| DTS-18 | Benzenediazonium, 4-(phenylamino)-, sulfate (1:1), polymer with formaldehyde; CAS 41432-19-3; available from PCAS (Longjouneau, France) via ChemSultants International, Fayetteville, NY |
| Elvanol ® 50-42 | High viscosity, 87-89% hydrolyzed polyvinyl alcohol; Du Pont, Wilmington, DE |
| Elvanol ® 51-05 | Low viscosity, 87-89% hydrolyzed polyvinyl alcohol; E. I. du Pont de Nemours and Co., Wilmington, DE |
| Magenta Pigment No. 1 | Sunsperse ® naphthol red pigment dispersion; Sun Chemical, Cincinnati, OH |
| Magenta Pigment No. 2 | Unisperse ® Red RBS-PI pigment dispersion; Ciba-Geigy Corporation, Ardsley, NY |
| Melinex ® D994 | Adhesive subbed opaque polyethylene terephthalate film base; ICI Americas, Wilmington, DE |
| Melinex ® 329 | Opaque polyethylene terephthalate film base; ICI Americas, Wilmington, DE |
| Polyox ® WSR N-3000 | Poly(ethylene oxide); MW 400,000; CAS 25372-68-3; Union Carbide, New York, NY |
| PVP K-30 | Polyvinylpyrrolidone (MW 40,000); GAF Corp., Wayne, NJ |
| PVP K-90 | Polyvinylpyrrolidone (MW 350,000); GAF Corp., Wayne, NJ |
| Regal ® 330R | Black pigment; Cabot Corp., Boston MA |
| Schoeller receptor | Resin coated paper sized for water resistance; Schoeller Technical Papers, Inc., Pulaski, NY |
| Tamol ® 731 | Sodium salt of a polymeric carboxylic acid Rohm & Haas, Philadelphia, PA |
| Vinac ® B-15 | Poly(vinyl acetate); M.W. 90,000; CAS 9003-20-7; Air Products and Chemicals, Allentown, PA |
| Vinac ® XX-240 | Poly(vinyl acetate) homopolymer emulsion; Air Products and Chemicals, Allentown, PA |
| Vinol ® 125 | Medium viscosity, 99.3% + hydrolyzed polyvinyl alcohol; MW 85,000-146,000; Air Products and Chemicals, Allentown, PA |
| Vinol ® 165 | High viscosity, 99.3% + hydrolyzed polyvinyl alcohol; MW 124,000-186,000; Air Products and Chemicals, Allentown, PA |
| Vinol ® 540S | High viscosity, 87.0-90.0% hydrolyzed polyvinyl alcohol; MW 124,000-186,000; Air Products and Chemicals, Allentown, PA |
| Yellow Pigment | Sunsperse ® 6000 Diarylide Yellow, AAOT; Sun Chemical, Cincinnati, OH |
| Zonyl ® FSO-100 | Nonionic fluorosurfactant; Du Pont Co., Wilmington, DE |

In the following Examples, "coating solution" refers to the mixture of solvent and additives which is coated, even though some of the additives may be in suspension rather than in solution. "Total solids" refers to the total amount of nonvolatile material in the coating solution even though some of the additives may be nonvolatile liquids at ambient temperature.

EXAMPLE 1

This example compares the performance of elements containing polyvinyl pyrrolidone binders with elements of this invention which contain polyvinyl alcohol binders in the photosensitive and colorant-containing layer(s). Elements in which the colorant and diazo resin were in the same layer were used. The adhesive layer was unnecessary since the objective of this example was to compare the initially formed images.

Coating Solutions Coating solutions were prepared from the ingredients shown in Table 1. The PVP containing coating solutions (Solutions A and B), were prepared by adding to water and stirring at room temperature to dissolve the mixture. Diazo resin was added and dissolved. The pigment dispersion was subsequently added and stirring continued for about an additional 4 hours. The PVA containing coating solutions (Solutions C and D) were prepared by adding to water and stirring at about 90° C. for 0.5 hours. Diazo resin was added to the cooled PVA solution. The pigment dispersion was subsequently added and stirring continued for about an additional 4 hours.

TABLE 1

| Ingredient[a] | Solution A | B | C | D |
|---|---|---|---|---|
| PVP K-30 | 2.60 | — | — | — |
| PVP K-90 | 2.60 | 5.19 | — | — |
| Vinol ® 540 | — | — | 4.90 | — |
| Vinol ® 165 | — | — | — | 4.93 |
| Diazo Resin No. 4 | 0.41 | 0.41 | 0.41 | 0.25 |
| Magenta Pigment No. 1 | 1.59 | 1.59 | 1.59 | 1.20 |
| Water | 92.81 | 92.81 | 93.10 | 93.62 |

[a]Percent by weight.

Coating Each solution was board coated onto a support of 50 micron polyethylene terephthalate film to produce a precolored photosensitive element consisting of support and photosensitive layer. All the solutions except solution D were coated with an 18 micron coating knife. Solution D was coated with a coating knife with a 50 micron gap. Coating weights are shown in Table 2.

Image Formation Each precolored photosensitive element was placed in a vacuum frame with the photosensitive layer up, i.e. facing the source of actinic radiation. A UGRA test strip (Graphic Arts Technical Foundation, Pittsburgh, Pa.; dot range 0.5% –99.5% dots) was placed on top of the photosensitive layer with the emulsion side in contact with the photosensitive layer and the base side up. A vacuum was drawn on the element and separation transparency for 90 sec prior to exposure. The element was then exposed for about 36 sec to radiation from a 6 kw high pressure mercury vapor lamp (Theimer, Exposure Systems Company, Bridgeport, Conn., equipped with a photopolymer bulb and Kokomo filter) about 54 in (137 cm) above the element and separation transparency.

Each exposed element was subsequently sprayed manually with tap water at room temperature, on the photosensitive side, to wash off the non-exposed areas of the photosensitive layer and then dried. The quality of the images formed with elements containing PVA binders was much sharper than those formed with PVP as shown in Table 2.

TABLE 2

| Solution[a] | Weight[b] | % Dots[c] | Microlines[d] | Edge Definition |
|---|---|---|---|---|
| A | 12.9 | 0.5-98 | 10 | Slightly fuzzy |
| B | 14.5 | 3-95 | 30 | Slightly fuzzy, cratering |
| C | 12.7 | 3-98 | 25 | Sharp, slightly undercut |
| D | 27.6 | 1-99.5 | 10 | Sharp to very sharp |

[a]Solutions A and B are controls.
[b]Coating weight in mg/dm².
[c]Dots held on a 150 lines/in (60 lines/cm) screen.
[d]Value (in microns) at which both positive and negative lines are held.

EXAMPLE 2

This example compares the performance of elements containing PVP binders with elements of this invention which contain polyvinyl alcohol. Elements in which the colorant and diazo resin were in the same layer were used.

Coating Each of the solutions prepared in Example 1 was board coated onto a support of about 23 micron polyethylene terephthalate film to produce a precolored photosensitive element consisting of support and photosensitive layer. All the solutions except Solution D were coated using a coating knife with an 38 micron gap. Solution D was coated with coating knife with a 50 micron gap. The coating was dried with a hot air gun. Then each photosensitive layer was overcoated with a 25% solution of Vinac ® B-15 in 92:8 dichloromethane/methanol using a coating knife with a 50 micron gap. Coating weights for the photosensitive layer and adhesive layer are shown in Table 3.

TABLE 3

| Solution[a] | Photosensitive Layer[b] | Adhesive Layer[b] |
|---|---|---|
| A | 16.0 | 108 |
| B | 19.0 | 106 |
| C | 18.4 | 96 |
| D | about 27 | about 100 |

[a]Solutions A and B are controls.
[b]Coating weight in mg/dm².

Image Formation Each precolored photosensitive element was laminated to Melinex ® 329 receptor at 100° C. with a Cromalin ® laminator. The support was removed to produce an element consisting of: receptor, adhesive layer, and photosensitive layer. Each precolored photosensitive element was placed in a vacuum frame with the photosensitive layer up, i.e, facing the source of actinic radiation, and exposed and washed out as described in Example 1. The quality of the images formed is provided in Table 4.

TABLE 4

| Solution[a] | % Dots[b] | Microlines[c] | Edge Definition |
|---|---|---|---|
| A | 0.5-98 | 10 | Fairly sharp, swelling, cratering |
| B | 1-96 | 20 | Fuzzy, swelling, cratering |
| C | 0.5-99.5 | 6 | Very sharp |
| D | 0.5-99 | 15 | Sharp |

[a]Solutions A and B are controls.
[b]Dots held on a 150 lines/in (60 lines/cm) screen.
[c]Value (in microns) at which both positive and negative lines are held.

EXAMPLE 3

This example compares the performance of elements containing PVP binders with elements of this invention which contain polyvinyl alcohol. Elements in which the colorant and diazo resin were in the same layer were used.

Coating Solutions A, B, and C prepared in Example 1 were each board coated and dried as described in Example 2. Each photosensitive layer was then overcoated with a 55% solution of Vinac ® XX-240 emulsion. A coating knife with a 50 micron gap was used for Solutions A and B and a coating knife with an eighteen micron gap was used for Solution C. Coating weights for the photosensitive layer and adhesive layer are shown in Table 5.

TABLE 5

| Solution[a] | Photosensitive Layer[b] | Adhesive Layer[b] |
| --- | --- | --- |
| A | 17.3 | 150 |
| B | 19.6 | 143 |
| C | 18.7 | 124 |

[a]Solutions A and B are controls.
[b]Coating weight in mg/dm².

Image Formation Each precolored photosensitive element was laminated to a Melinex® 329 receptor, exposed, and washed out as described in Example 2. The quality of the images formed with elements containing PVA binders is sharp as shown in Table 6.

TABLE 6

| Solution | % Dots[a] | Microlines[b] | Edge Definition |
| --- | --- | --- | --- |
| A | 1–98 | 6 | Sharp |
| B | 0.5–98 | 10 | Sharp |
| C | 0.5–99.5 | 6 | Very sharp |

[a]Dots held on a 150 lines/in (60 lines/cm) screen.
[b]Value (in microns) at which both positive and negative lines are held.

EXAMPLE 4

This example illustrates the preparation of a four color surprint proof prepared from precolored elements in which the colorant and the photosensitive material were present in a single layer.

Step 1. Coating solutions for the colorant-containing photosensitive layers of the magenta, cyan, yellow and black photosensitive elements were prepared from the ingredients shown in Table 7. Each solution was prepared by the same procedure used to prepare the Vinol® 165 solution described in Example 1.

TABLE 7

| Ingredient[a] | Magenta | Cyan | Yellow | Black |
| --- | --- | --- | --- | --- |
| Vinol® 165 | 4.9 | 4.9 | 4.9 | 4.6 |
| Diazo Resin No. 4 | 0.25 | 0.24 | 0.25 | 0.19 |
| Magenta Pigment No. 1 | 1.6 | — | — | — |
| Cyan Pigment | — | 1.8 | — | — |
| Yellow Pigment | — | — | 1.5 | — |
| Black Pigment Dispersion[b] | — | — | — | 7.0 |
| Tamol® 731 | — | 0.10 | 0.10 | — |
| Zonyl® FSO-100 | 0.05 | 0.05 | 0.05 | — |
| Aerosol® TO-75 | — | — | — | — |
| Water | 93.2 | 92.9 | 93.2 | 94.4 |

[a]Percent by weight
[b]7.7 g Regal® 330 milled into 89.1 g water, 2.7 g Vinol® 165, 0.14 g Tamol® 731, and 0.35 g Aerosol® TO 75.

Step 2. Each of the solutions produced in Step 1 was coated onto a support of 25 micron polyethylene terephthalate film as described in Example 1 using a coating knife with a 50 micron gap. The coating weights were: about 25 mg/dm² for the magenta photosensitive layer, 23 mg/dm² for the cyan, 25 mg/dm² for the yellow, and 42 mg/dm² for the black.

Step 3. A solution which was 20% by weight Vinac® B-15 in ethyl acetate was coated on top of each of the photosensitive layers of each of the elements produced in Step 2 and dried to produce four precolored elements, each consisting of: support, precolored photosensitive layer, and adhesive layer. The Vinac® B-15 coating weight was about 50 to 120 mg/dm².

Step 4. The adhesive layer of the yellow precolored element produced in Step 3 was laminated at 110° C. onto a receptor of 230 micron Melinex® D994. The support was peeled off after lamination to leave an element consisting of: precolored photosensitive layer, adhesive layer, and receptor.

Step 5. The element produced in Step 4 was placed in a vacuum frame with the photosensitive layer up, i.e. facing the source of actinic radiation. A yellow halftone negative separation transparency was placed on top of the photosensitive layer with the emulsion side in contact with the photosensitive layer and the base side up. Exposure for 29 sec was carried out as described in Example 1.

Step 6. The exposed element produced in Step 5 was manually sprayed with tap water on the photosensitive side to wash off the non-exposed areas of the photosensitive layer and then dried with an air gun. The resulting element was a single color surprint image consisting of: receptor, adhesive layer, and exposed and developed yellow photosensitive layer.

Step 7. Following the procedure given in step 4, the magenta precolored photosensitive element produced in Step 3 was laminated onto the element produced in Step 6 to produce an element consisting of: receptor, adhesive layer, exposed and developed yellow photosensitive layer, adhesive layer, magenta photosensitive layer, and support. The support was removed. and the resulting element was exposed for 59 sec through a magenta halftone negative separation transparency and developed as described in Step 5. The resulting element was a two color surprint image consisting of: receptor, adhesive layer, exposed and developed yellow photosensitive layer, adhesive layer, and exposed and developed magenta photosensitive layer was produced.

Step 8. Following the procedure given in step 4, the cyan precolored photosensitive element produced in Step 3 was laminated onto the element produced in Step 7 to produce an element consisting of: receptor, adhesive layer, exposed and developed yellow photosensitive layer, adhesive layer, exposed and developed magenta photosensitive layer, adhesive layer, cyan photosensitive layer, and support. The support was removed. The resulting element was exposed for 88 sec through a cyan negative separation transparency and developed as described in Step 5. The resulting element was a three color surprint image consisting of: receptor, adhesive layer, exposed and developed yellow photosensitive layer, adhesive layer, exposed and developed magenta photosensitive layer, adhesive layer, and exposed and developed cyan photosensitive layer was produced.

Step 9. Following the procedure given in step 4, the black precolored photosensitive element produced in Step 3 was laminated onto the element produced in Step 8 to produce an element consisting of: receptor, adhesive layer, exposed and developed yellow photosensitive layer, adhesive layer, exposed and developed magenta photosensitive layer, adhesive layer, exposed and developed cyan photosensitive layer, adhesive layer, black photosensitive layer, and support. The support was removed. The resulting element was exposed for 88 sec through a black halftone negative separation transparency and developed as described in Step 5. The resulting element was a four color surprint image consisting of: receptor, adhesive layer, exposed and developed yellow photosensitive layer, adhesive layer, exposed and developed magenta photosensitive layer, adhesive layer, exposed and developed cyan photosensitive layer, adhesive layer, and exposed and developed black photosensitive layer.

EXAMPLE 5

This example illustrates the preparation of a four color surprint proof from precolored elements in which the colorant and the photosensitive resin are present in separate layers. The element consist of: support, colorant-containing layer, photosensitive layer, and adhesive layer, as in preferred embodiment (6).

Step 1. Coating solutions for the precolored layers of the magenta, cyan, yellow and black precolored photosensitive elements were prepared from the ingredients shown in Table 8 following the procedure of Example 4.

TABLE 8

| Ingredient[a] | Magenta | Cyan | Yellow | Black |
| --- | --- | --- | --- | --- |
| Vinol ® 125 | 7.2 | 7.4 | 7.4 | — |
| Vinol ® 165 | — | — | — | 4.6 |
| Magenta Pigment No. 1 | 3.6 | — | — | — |
| Cyan Pigment | — | 1.7 | — | — |
| Yellow Pigment | — | — | 1.5 | — |
| Black Pigment Dispersion | — | — | — | 1.3 |
| Tamol ® 731 | 0.1 | 0.07 | 0.07 | 0.1 |
| Aerosol ® TO-75 | 0.07 | 0.05 | 0.05 | 0.08 |
| Water | 89.0 | 90.8 | 91.0 | 93.9 |

[a]Percent by weight

Step 2. Each of the solutions prepared in Step 1 was coated onto a support and dried as described in Step 2 of Example 4 to produce a set of four elements each consisting of a support and a precolored layer. Coating weights were about 21 mg/dm² for the magenta element, 6 mg/dm² for the cyan, 25 mg/dm² for the yellow, and 8 mg/dm² for the black.

Step 3. A photosensitive solution, consisting of 7.5 parts by weight Vinol ® 125, 0.4 part Diazo Resin No. 4, 0.1 part Zonyl ® FSO-100 and 92 parts water, was coated with a doctor knife with an 18 micron gap on top of each of the precolored layers and dried with an air gun to produce a set of four precolored photosensitive elements each consisting of: support, colorant-containing layer, and photosensitive layer. Coating weights were 12 mg/dm² for the magenta element, 31 mg/dm² for cyan, 8 mg/dm² for yellow, and 19 mg/dm² for black.

Step 4. An adhesive solution of the same composition as that described in Example 4 was coated on top of each of the photosensitive layers of each of the elements produced in Step 3 and dried in air to a set of four precolored photosensitive elements each consisting of, in order: support, colorant-containing layer, photosensitive layer, and adhesive layer. Coating weight of the adhesive layer was about 50–120 mg/dm².

Step 5. The yellow element produced in Step 4 was laminated at 110° C. with a Cromalin ® laminator with the adhesive side onto a 230 micron Melinex ® D994 receptor. The support was peeled away, leaving an element consisting of, in order: receptor, adhesive layer, photosensitive layer, and colorant-containing layer. The element was exposed for 29 sec to actinic light through a yellow negative separation transparency as described in Step 5 of Example 4 and developed by spraying with tap water as described in Step 6 of Example 4. The resulting element was a single color surprint image consisting of: receptor; adhesive layer; exposed and developed photosensitive layer; and developed yellow colorant-containing layer. The exposed areas of both the colorant-containing and photosensitive layers remain during development; the adhesive layer was not affected by the development process.

Step 6. The magenta element was laminated onto the yellow image produced in Step 5 and the support removed to produce an element consisting of, in order: receptor; adhesive layer; exposed and developed photosensitive layer; developed yellow colorant-containing layer; adhesive layer; photosensitive layer; magenta colorant-containing layer. The element was exposed for 44 sec in register through a magenta color separation separation transparency and developed as described in Step 5.

Step 7. The procedure of Step 6 was followed with cyan and black photosensitive elements to produce a four color image consisting of, in order: receptor; adhesive layer; exposed and developed photosensitive layer; developed yellow colorant-containing layer; adhesive layer; exposed and developed photosensitive layer; developed magenta colorant-containing layer; adhesive layer; exposed and developed photosensitive layer; developed cyan colorant-containing layer; adhesive layer; exposed and developed photosensitive layer; and developed black colorant-containing layer.

EXAMPLE 6

This example illustrates the preparation of a four color surprint proof from precolored elements in which the colorant and the photosensitive resin are present in separate layers. The element consist of: support, colorant-containing layer, photosensitive layer, and adhesive layer, as in preferred embodiment (6). The preferred diazo resin is used in the photosensitive layer.

Step 1. A photosensitive solution consisting of 5.0 parts by weight Vinol ® 165, 0.26 parts Diazo Resin No. 4, 0.04 parts Zonyl ® FSO-100 and 94.7 parts water, was coated onto a support of 25 micron polyethylene terephthalate. Four separate films with coating weights of about 8 mg/dm² to 12 mg/dm² were obtained.

Step 2. Four color solutions of magenta, cyan, yellow and black were produced as described in Example 4. The compositions are given in Table 9.

TABLE 9

| Ingredient[a] | Magenta | Cyan | Yellow | Black |
| --- | --- | --- | --- | --- |
| Vinol ® 540S | 4.9 | 4.9 | 4.9 | 4.9 |
| Magenta Pigment No. 1 | 1.6 | — | — | — |
| Blue Pigment | — | 1.8 | — | — |
| Yellow Pigment | — | — | 1.5 | — |
| Black Pigment No. 1 | — | — | — | 1.6 |
| Zonyl ® FSO-100 | 0.06 | 0.06 | 0.06 | 0.06 |
| Water | 93.4 | 93.2 | 93.5 | 92.5 |

[a]Percent by weight

Each of these solutions was coated onto one of the photosensitive layers formed in Step 1. Coating weights for the colorant-containing layers were about 9 mg/dm² for magenta, 12 mg/dm² for cyan, 20 mg/dm² for yellow, and 11 mg/dm² for black.

Step 3. The adhesive solution, consisting of 24.9 parts by weight Vinac ® B-15, 0.1 part Zonyl ® FSO-100, 6.0 parts methanol, and 69 parts methylene chloride, was coated on top of each of the colorant-containing layers to give an element consisting of: support; photosensitive layer; colorant-containing layer; and adhesive layer. Coating weights were about 99 to about 116 mg/dm².

Step 4. The yellow photosensitive element formed in Step 3 was laminated at 110° C. with a Cromalin ® laminator onto a receptor of Melinex ® 329. The support was peeled away to leave an element consisting of: receptor; adhesive layer; colorant-containing layer; and photosensitive layer. The photosensitive layer was exposed for 56 sec through a yellow negative separation transparency and developed following the procedure of Step 5 of Example 5.

Step 5. Following the procedure of Steps 6 and 7 of Example 5, a four color image was produced consisting of, in order: receptor; adhesive layer; developed yellow colorant-containing layer; exposed and developed photosensitive layer; adhesive layer; developed magenta colorant-containing layer; exposed and developed photosensitive layer; adhesive layer; developed cyan colorant-containing layer; exposed and developed photosensitive layer; adhesive layer; developed black colorant-containing layer; and exposed and developed photosensitive layer.

EXAMPLE 7

This example illustrates formation of colored images using DTS-18 diazo resin.

Coating Solutions Coating solutions were prepared from the ingredients shown in Table 10 following the procedure used to prepare the Vinol ® 165 solution as described in Example 1.

TABLE 10

| Ingredient[a] | Magenta Element | | Cyan Element | |
|---|---|---|---|---|
| | Pre-colored Layer | Photo-sensitive Layer | Pre-colored Layer | Photo-sensitive Layer |
| Elvanol ® 50-42 | 4.9 | 9.9 | 4.9 | 5.0 |
| Magenta Pigment No. 1 | 3.3 | — | — | — |
| Cyan Pigment | — | — | 1.1 | — |
| DTS-18 | — | 0.50 | — | 0.25 |
| Zonyl ® FSO-100 | — | 0.099 | — | 0.10 |
| Aerosol ® TO-100 | — | — | 0.099 | — |
| Water | 91.8 | 89.5 | 93.9 | 94.6 |

[a]percent by weight

Coating Precolored solutions for the magenta and cyan film elements were each board coated onto a support of about 50 micron polyethylene terephthalate film using a 38 micron coating knife and dried with an air gun. Photosensitive solutions for the respective elements were then coated on top of the corresponding precolored layers. The magenta photosensitive solution was coated using an 18 micron coating knife while a 38 micron knife was used to coat the cyan photosensitive solution. Each of the coated layers was dried using an air gun. An adhesive solution, consisting of 24.9 parts by weight Vinac ® B-15, 0.5 part by weight Polyox ® WSR N-3000, 6.0 parts by weight methanol and 68.6 parts by weight methylene chloride, was coated onto each of the photosensitive layers using a coating knife with a 50 micron coating gap. Coating weights for each of the precolored and photosensitive layers are shown in Table 11. Adhesive layer coating weights were estimated to be about 120 mg/dm$^2$.

Image Formation Each precolored photosensitive element was laminated to Schoeller receptor at 110° C. with a Cromalin ® laminator. The support was removed to produce an element consisting of: receptor, adhesive layer, photosensitive layer, and precolored layer. Each precolored photosensitive element was placed in a vacuum frame with the precolored layer up and exposed and washed out as described in Example 1. Exposure times were about 80 sec for magenta and 100 sec for cyan. Quality of the images formed is provided in Table 11.

TABLE 11

| Element | Pre-colored Layer[a] | Photo-sensitive Layer[a] | % Dots[b] | Image Quality | |
|---|---|---|---|---|---|
| | | | | Microlines[c] | Edge Definition |
| Magenta | 23.5 | 32.6 | 0.5–99.5 | 8 | very sharp |
| Cyan | 20.7 | 33.7 | 0.5–99.5 | 15 | sharp |

[a]Coating weight in mg/dm$^2$.
[b]Dots held on a 150 lines/in (60 lines/cm) screen.
[c]Value (in microns) at which both positive and negative lines are held.

EXAMPLE 8

This example illustrates the preparation of a four color overlay proof from precolored elements in which the colorant and the photosensitive material were present in a single layer.

Step 1. Coating solutions for the colorant-containing photosensitive layers of the magenta, cyan, yellow and black photosensitive elements were prepared from the ingredients shown in Table 12. Each solution was prepared by first adding the Elvanol ® 50-42 to water and stirring at about 90° C. for 0.5 hr. The solution was cooled. Diazo resin and Zonyl ® FSO-100 were added to the cooled solution. The pigment dispersion was subsequently added and stirring continued for about an additional 12 hr.

TABLE 12

| Ingredient[a] | Magenta | Cyan | Yellow | Black |
|---|---|---|---|---|
| Elvanol ® 50-42 | 5.38 | 5.38 | 5.38 | 5.38 |
| Diazo Resin DTS-18 | 0.27 | 0.27 | 0.27 | 0.27 |
| Magenta Pigment No. 2 | 3.14 | — | — | — |
| Cyan Pigment | — | 2.15 | — | — |
| Yellow Pigment No. 1 | — | — | — | 2.74 |
| Zonyl ® FSO-100 | 0.051 | 0.052 | 0.051 | 0.051 |
| Water | 91.16 | 92.15 | 91.33 | 91.56 |

[a]Percent by weight

Step 2. Each solution was coated onto the treated side of a support of a 50 micron corona discharge treated photographic grade polyethylene terephthalate film to produce a precolored element consisting of support and colorant-containing photosensitive layer. The coating weights were: about 16 mg/dm$^2$ for the magenta photosensitive layer, 13 mg/dm$^2$ for cyan, 16 mg/dm$^2$ for yellow, and 13 mg/dm$^2$ for black.

Step 3. Each precolored photosensitive element was placed in a vacuum frame with the photosensitive layer up, i.e., facing the source of actinic radiation.

Negative separation transparencies for yellow, magenta, cyan and black were placed on top of each of the corresponding precolored photosensitive elements with the emulsion side of the transparency in contact with the photosensitive layer and the base side up. A vacuum was drawn on the element and separation transparency for 90 sec prior to exposure and the elements exposed as described in Example 1. Exposure times were: about 60 sec for the yellow photosensitive element, 30 sec for magenta, 60 sec for cyan and 300 sec for black.

Step 4. Each exposed photosensitive element was developed with tap water using a conventional film processor. The processor had a fine water spray, a rotating brush, and dryer sections to wash off the nonexposed areas of the photosensitive layer and dry the developed element. Each element consisted of support and exposed and developed colorant-containing photosensitive layer.

Step 5. The exposed and developed elements were assembled to form an overlay proof. The element containing the yellow image was placed on an about 125 micron thick Melinex® 329 receptor sheet with the support in contact with the receptor sheet. The element was taped along the left side to hold it in position. The element containing the magenta image was overlaid in register on the yellow image with and fixed in position. The elements containing the cyan and the black images were overlaid in register and fixed to obtain a four color overlay proof consisting of, in order: receptor sheet, yellow image containing element, magenta image containing element, cyan image containing element, and black image containing element.

EXAMPLE 9

This example illustrates the preparation of a four color overlay proof from precolored elements in which the colorant and the photosensitive material are in separate layers.

Step 1. Coating solutions for the photosensitive and precolored layers of the magenta, cyan, yellow and black precolored photosensitive elements were prepared from the ingredients shown in Table 13 following the general procedure of Example 8. Each solution was prepared by first adding the poly(vinyl alcohol) (Elvanol® 50-42 and Elvanol® 51-05) to water and stirring at about 90° C. for 0.5 hr. The solutions were cooled and subsequent additions made as described in Example 8.

TABLE 13

| Ingredient[a] | PSL[b] | Magenta[c] | Cyan[c] | Yellow[c] | Black[c] |
| --- | --- | --- | --- | --- | --- |
| Elvanol ® 50-42 | 6.64 | 3.71 | 3.74 | 3.69 | 3.94 |
| Elvanol ® 51-05 | — | 1.99 | 2.00 | 2.02 | 2.12 |
| Diazo Resin DTS-18 | 0.33 | — | — | — | — |
| Magenta Pigment No. 1 | — | 2.75 | — | — | — |
| Cyan Pigment | — | — | 2.32 | — | — |
| Yellow Pigment | — | — | — | 2.69 | — |
| Black Pigment No. 1 | — | — | — | — | 2.00 |
| Aerosol ® TO-100 | 0.054 | — | — | — | — |
| Zonyl ® FSO-100 | 0.081 | 0.051 | 0.052 | 0.051 | 0.052 |
| Water | 92.90 | 91.5 | 91.89 | 91.55 | 91.89 |

[a]Percent by weight
[b]Photosensitive layer
[c]Colorant-containing layer.

Step 2. The coating solution for the photosensitive layer and the coating solution for the yellow colorant-containing layer were simultaneously coated onto a support of 50 micron thick photographic grade polyethylene terephthalate film to form a precolored photosensitive element consisting of: support, photosensitive layer, and yellow colorant-containing layer. The magenta, cyan, and black precolored elements were prepared by similar procedures. Coating weights as shown in Table 14.

TABLE 14

| | Coating Weight[a] | | | |
| --- | --- | --- | --- | --- |
| | Magenta | Cyan | Yellow | Black |
| Photosensitive Layer | 16 | 9 | 11 | 15 |
| Colorant-containing Layer | 16 | 17 | 18 | 17 |

[a]mg/dm².

Step 3. Each precolored photosensitive element was placed in a vacuum frame with the colorant-containing layer up and exposed through the corresponding negative separation transparency as in Step 3 of Example 8. Exposure times were: about 220 sec for the yellow photosensitive element, 140 sec for magenta, 350 sec for cyan, and 700 sec for black.

Step 4. Each exposed element was sprayed manually with tap water on the photosensitive side to wash off the non-exposed areas of the precolored and photosensitive layers and then dried to produce an exposed and developed image containing photosensitive element consisting of: support, exposed and developed photosensitive layer, and developed colorant-containing layer.

Step 5. The exposed and developed elements were assembled as described in Step 5 of Example 8 to form a four color overlay proof consisting of, in order: receptor sheet, yellow image containing element, magenta image containing element, cyan image containing element, and black image containing element.

Example 10

This example illustrates the preparation of a four color overlay proof from precolored elements in which the colorant and the photosensitive resin are in separate layers. Imagewise exposure is made through the support.

The procedure of Example 9 was repeated using the precolored photosensitive elements prepared in Example 9 except that each element was placed in the vacuum frame with the support up, i.e, facing the source of actinic radiation so that exposure of the element was carried out through a separation transparency and the support. The emulsion side of the transparency was in contact with support. A vacuum was drawn on the element and separation transparency for 60 sec prior to exposure. The elements were exposed with the radiation from a 5 kW high pressure mercury vapor lamp (Ascor Addalux, Burkey Ascor, equipped with a diazo bulb and Kokomo filter) about 35 in (89 cm) above the element and separation transparency. The exposure times were: about 100 sec for yellow, 150 sec for magenta, 150 sec for cyan and 250 sec for black.

Each exposed element was developed with tap water as described in Step 4 of Example 8 and then dried to produce an exposed and developed image containing precolored photosensitive element consisting of: support, exposed and developed photosensitive layer, and developed colorant-containing layer.

The exposed and developed elements were assembled to form an overlay proof. The procedure of Step 5 of Example 8 was followed except that the yellow image containing photosensitive element was placed on the support with its developed colorant-containing layer in contact with the receptor. Each successive element was placed in register with its developed colorant-containing layer in contact with the support of the preceding element to form a four color overlay proof consisting of, in order: receptor sheet, yellow image containing element, magenta image containing element, cyan image containing element, and black image containing element.

EXAMPLE 11

This example illustrates formation of colored images from a precolored element in which the colorant and the photosensitive resin are in separate layers.

Step 1. Coating solutions for the photosensitive and precolored layers of a black precolored photosensitive element were prepared from the ingredients shown in Table 15 following the procedure of Example 8.

TABLE 15

| Ingredient[a] | Photosensitive Layer | Black |
| --- | --- | --- |
| Elvanol ® 50-42 | 4.99 | 4.91 |
| Diazo Resin DTS-18 | 0.25 | — |
| Black Pigment No. 2 | — | 1.72 |
| Zonyl ® FSO-100 | 0.037 | 0.025 |
| Water | 94.72 | 93.34 |

[a]Percent by weight

Step 2. The colorant-containing layer coating solution was board coated onto the treated side of a support of 50 micron electric discharge treated, photographic grade polyethylene terephthalate film to produce an element consisting of support and black colorant-containing layer. The colorant-containing layer coating solution was coated using an 18 micron coating knife and then dried with an air gun to obtain a coating weight of about 14 mg/dm$^2$. The photosensitive layer coating solution was then coated on top of the black colorant-containing layer. The photosensitive layer coating solution was coated with a coating knife with a 36 micron gap to obtain a dried coating weight of about 20 mg/dm$^2$. The resulting element consisted of: support, black colorant-containing layer, and photosensitive layer.

Step 3. The black photosensitive element prepared in Step 2 was placed in a vacuum frame with the photosensitive layer up and exposed for about 60 sec through a black negative separation transparency as in Step 3 of Example 8.

Step 4. The exposed element was developed with tap water as described in Step 4 of Example 8. The exposed areas of both the colorant-containing and photosensitive layers remained during development to leave a sharp image consisting of: support, developed colorant-containing layer, and exposed and developed photosensitive layer.

To form an overlay proof, additional precolored, photosensitive elements may be prepared as described in Steps 1 and 2 using differently colored pigments, such as those used in Example 8, in place of the black pigment. The elements may be exposed and developed as described in Steps 3 and 4 to produce a series of colored images, each consisting of: support, developed colorant-containing layer, and exposed and developed photosensitive layer. The colored images may be stacked in register as described in Step 5 of Example 8 to form an overlay proof.

Having described the invention, we now claim the following and their equivalents.

What is claimed is:

1. An image reproduction process comprising the steps of:

(A) providing a precolored, water-developable, photosensitive element comprising:
  (1) a support;
  (2) a single colorant-containing layer consisting essentially of:
    (a) a colorant, and
    (b) a polyvinyl alcohol binder, said binder being about 87–100% hydrolyzed and being of sufficiently high molecular weight to be film-forming; and
  (3) a photosensitive layer consisting essentially of:
    (c) a photosensitive, water-soluble, polymeric diazo resin; and
    (d) a polyvinyl alcohol binder, said binder being about 87–100% hydrolyzed and being of sufficiently high molecular weight to be film-forming; and
  (4) an adhesive layer; wherein said colorant-containing layer (2) and said photosensitive layer (3) may be combined into a single layer colorant-containing, photosensitive coating (5) which must be in contact with the adhesive layer (4) or alternatively said colorant-containing layer (2) and said photosensitive layer (3) may be in separate but contiguous layers provided that either layer (2) or (3) must be in contact with the adhesive layer (4), and provided that either the colorant-containing layer (2), the photosensitive layer (3) or the adhesive layer (4) is in contact with the support (1);

(B) exposing imagewise the precolored photosensitive element to actinic radiation;

(C) developing the image by washing out the unexposed areas with a solvent consisting essentially of water.

2. A process of claim 1 wherein the element comprises, in order: support (1); adhesive layer (4); photosensitive layer (3); and colorant containing layer (2).

3. A process of claim 1 wherein the element comprises, in order: support (1); colorant-containing layer (2); photosensitive layer (3); and adhesive layer (4).

4. A process of claim 1 wherein said colorant-containing layer (2) and said photosensitive layer (3) are combined into a single layer colorant-containing, photosensitive coating.

5. A process of claim 1 wherein said polymeric diazo resin is a 4-(phenylamino)-benzenediazonium formaldehyde polymer.

6. A process of claim 1 wherein said support (1) is a temporary support and said process additionally comprises the steps of, in order, following step (C):

(D) transferring the image to a temporary carrier;

(E) removing said temporary support, and (F) transferring the image to a permanent support to form a surprint proof.

7. A process of claim 6 wherein the element comprises, in order: support (1), photosensitive layer (3), and colorant-containing layer (2).

8. A process of claim 6 wherein the element comprises, in order: support (1), colorant-containing layer (2), and photosensitive layer (3).

9. A process of claim 6 wherein said colorant-containing layer (2) and said photosensitive layer (3) are combined into a single layer colorant-containing, photosensitive coating.

10. A process of claim 6 wherein said polymeric diazo resin is selected from the group consisting of a zinc chloride complex of a 4-(phenylamino)-benzenediazonium sulfate (1:1) formaldehyde polymer, a zinc chloride complex of 4-(phenylamino)-benzenediazonium phosphate (1:1) formaldehyde polymer, a cobalt chloride complex of 4-(phenylamino)-benzenediazonium (1:1) formaldehyde polymer, uncomplexed 4-(phenylamino)-benzenediazonium phosphate (1:1) formaldehyde polymer, and uncomplexed 4-(phenylamino)-benzenediazonium sulfate (1:1) formaldehyde polymer.

11. A process of claim 6 wherein said polymeric diazo resin is selected from the group consisting of uncomplexed 4-(phenylamino)-benzenediazonium phosphate (1:1) formaldehyde polymer and uncomplexed 4-(phenylamino)-benzenediazonium sulfate (1:1) formaldehyde polymer.

12. A process of claim 6 wherein said adhesive layer consists essentially of polyvinyl acetate.

13. A process of claim 6 wherein steps (A) to (E) are repeated a plurality of times with a plurality of said precolored, water-developable, photosensitive elements; said colored images are transferred in register to said temporary carrier to form a multilayer image; and said multilayer image is transferred to said permanent support to form a multicolored surprint proof.

14. A process of claim 13 wherein said polymeric diazo resin is selected from the group consisting of uncomplexed 4-(phenylamino)-benzenediazonium phosphate (1:1) formaldehyde polymer and uncomplexed 4-(phenylamino)-benzenediazonium sulfate (1:1) formaldehyde polymer and said adhesive layer consists essentially of polyvinyl acetate.

15. A process of claim 1 wherein said support is a temporary support and said process additionally comprises the steps of:
(D) adhering said photosensitive element to a permanent support, before step (B); and
(E) removing said temporary support, after step (D) and either before step (B) or after step (B) and before step (C) to from a colored image on a permanent support.

16. A process of claim 15 wherein the element comprises, in order: support (1), photosensitive layer (3), and colorant-containing layer (2).

17. A process of claim 15 wherein the element comprises, in order: support (1), colorant-containing layer (2), and photosensitive layer (3).

18. A process of claim 15 wherein said colorant-containing layer (2) and said photosensitive layer (3) are combined into a single layer colorant-containing, photosensitive coating.

19. A process of claim 15 wherein said polymeric diazo resin is selected from the group consisting of a zinc chloride complex of 4-(phenylamino)-benzenediazonium sulfate (1:1) formaldehyde polymer, a zinc chloride complex of 4-(phenylamino)-benzenediazonium phosphate (1:1) formaldehyde polymer, a cobalt chloride complex of 4-(phenylamino)-benzenediazonium (1:1) formaldehyde polymer, uncomplexed 4-(phenylamino)-benzenediazonium phosphate (1:1) formaldehyde polymer, and uncomplexed 4-(phenylamino)-benzenediazonium sulfate (1:1) formaldehyde polymer.

20. A process of claim 15 wherein said polymeric diazo resin is selected from the group consisting of uncomplexed 4-(phenylamino)-benzenediazonium phosphate (1:1) formaldehyde polymer and uncomplexed 4-(phenylamino)-benzenediazonium sulfate (1:1) formaldehyde polymer.

21. A process of claim 15 wherein said adhesive layer consists essentially of polyvinyl acetate.

22. A process of claim 15 wherein said process additionally comprises the steps of, following step (E):
(F) adhering an additional photosensitive element comprising a temporary support and a photosensitive coating to the colored image formed in step (E);
(G) removing said temporary support after step (F) and either before step (H) or after step (H) and before step (I);
(H) imagewise exposing said photosensitive coating with actinic radiation; and
(I) developing an image by washing out the unexposed areas with a solvent consisting essentially of water; wherein steps (F) to (I) may be carried out with additional photosensitive elements as many times as desired, wherein each additional photosensitive element is adhered to the colored image produced in step (I), to form a multilayer, multicolored surprint proof.

23. A process of claim 22 wherein said polymeric diazo resin is selected from the group consisting of uncomplexed 4-(phenylamino)-benzenediazonium phosphate (1:1) formaldehyde polymer and uncomplexed 4-(phenylamino)-benzenediazonium sulfate (1:1) formaldehyde polymer and said adhesive layer consists essentially of polyvinyl acetate.

24. A process for forming a colored image comprising:
(A) imagewise exposing a precolored, water-developable photosensitive element comprising:
(1) a support;
(2) a single colorant-containing layer consisting essentially of:
(a) a colorant, and
(b) a polyvinyl alcohol binder, said binder being about 87–100% hydrolyzed and being of sufficiently high molecular weight to be film-forming; and
(3) a photosensitive layer consisting essentially of:
(c) a photosensitive, water-soluble, polymeric diazo resin; and
(d) a polyvinyl alcohol binder, said binder being about 87–100% hydrolyzed and being of sufficiently high molecular weight to be film-forming; wherein either said colorant-containing layer (2) and said photosensitive layer (3) are combined into a single layer colorant containing, photosensitive coating, or said colorant-containing layer (2) and said photosensitive layer (3) are in separate but contiguous layers; and
(B) developing the image by washing out the unexposed areas with a solvent consisting essentially of water.

25. A process of claim 24 wherein said polymeric diazo resin is a 4-(phenylamino)-benzenediazonium formaldehyde polymer.

26. A process of claim 24 wherein the element comprises, in order: support (1), photosensitive layer (3), and colorant-containing layer (2).

27. A process of claim 24 wherein the element comprises, in order: support (1), colorant-containing layer (2), and photosensitive layer (3).

28. A process of claim 24 wherein said colorant-containing layer (2) and said photosensitive layer (3) are combined into a single layer colorant-containing, photosensitive coating.

29. A process of claim 24 wherein said support (1) is optically transparent; steps (A) to (C) are repeated a plurality of times with a plurality of said precolored, water-developable, photosensitive elements; and the resulting colored images are stacked in register to form an overlay proof.

30. A process of claim 29 wherein the element comprises, in order: support (1), photosensitive layer (3), and colorant-containing layer (2).

31. A process of claim 30 wherein said polymeric diazo resin is a 4-(phenylamino)-benzenediazonium formaldehyde polymer.

32. A process of claim 30 wherein said polymeric diazo resin is selected from the group consisting of a zinc chloride complex of 4-(phenylamino)-benzenediazonium sulfate (1:1) formaldehyde polymer, a zinc chloride complex of 4-(phenylamino)-benzenediazonium phosphate (1:1) formaldehyde polymer, a cobalt chloride complex of 4-(phenylamino)-benzenediazonium (1:1) formaldehyde polymer, uncomplexed 4-(phenylamino)-benzenediazonium phosphate (1:1) formaldehyde polymer, and uncomplexed 4-(phenylamino)-benzenediazonium sulfate (1:1) formaldehyde polymer.

33. A process of claim 30 wherein said polymeric diazo resin is selected from the group consisting of uncomplexed 4-(phenylamino)-benzenediazonium phosphate (1:1) formaldehyde polymer and uncomplexed 4-(phenylamino)-benzenediazonium sulfate (1:1) formaldehyde polymer.

34. A process of claim 29 wherein the element comprises, in order: support (1), colorant-containing layer (2), and photosensitive layer (3).

35. A process of claim 34 wherein said polymeric diazo resin is a 4-(phenylamino)-benzenediazonium formaldehyde polymer.

36. A process of claim 34 wherein said polymeric diazo resin is selected from the group consisting of a zinc chloride complex of 4-(phenylamino)-benzenediazonium sulfate (1:1) formaldehyde polymer, a zinc chloride complex of 4-(phenylamino)-benzenediazonium phosphate (1:1) formaldehyde polymer, a cobalt chloride complex of 4-(phenylamino)-benzenediazonium (1:1) formaldehyde polymer, uncomplexed 4-(phenylamino)-benzenediazonium phosphate (1:1) formaldehyde polymer, and uncomplexed 4-(phenylamino)-benzenediazonium sulfate (1:1) formaldehyde polymer.

37. A process of claim 34 wherein said polymeric diazo resin is selected from the group consisting of the uncomplexed 4-(phenylamino)-benzenediazonium phosphate (1:1) formaldehyde polymer and the uncomplexed 4-(phenylamino)-benzenediazonium sulfate (1:1) formaldehyde polymer.

38. A process of claim 29 wherein said colorant-containing layer (2) and said photosensitive layer (3) are combined into a single layer colorant-containing, photosensitive coating in contact with said support (1).

39. A process of claim 38 wherein said polymeric diazo resin is a 4-(phenylamino)-benzenediazonium formaldehyde polymer.

40. A process of claim 38 wherein said polymeric diazo resin is selected from the group consisting of a zinc chloride complex of 4-(phenylamino)-benzenediazonium sulfate (1:1) formaldehyde polymer, a zinc chloride complex of 4-(phenylamino)-benzenediazonium phosphate (1:1) formaldehyde polymer, a cobalt chloride complex of 4-(phenylamino)-benzenediazonium (1:1) formaldehyde polymer, uncomplexed 4-(phenylamino)-benzenediazonium phosphate (1:1) formaldehyde polymer, and uncomplexed 4-(phenylamino)-benzenediazonium sulfate (1:1) formaldehyde polymer.

41. A process of claim 38 wherein said polymeric diazo resin is selected from the group consisting of uncomplexed 4-(phenylamino)-benzenediazonium phosphate (1:1) formaldehyde polymer and uncomplexed 4-(phenylamino)-benzenediazonium sulfate (1:1) formaldehyde polymer.

* * * * *